(12) United States Patent  (10) Patent No.: US 6,884,319 B2
Kim  (45) Date of Patent: Apr. 26, 2005

(54) SUSCEPTOR OF APPARATUS FOR MANUFACTURING SEMICONDUCTOR DEVICE

(75) Inventor: Yong-Jin Kim, Gyeonggi-do (KR)

(73) Assignee: Jusung Engineering Co., Ltd. (KR)

( * ) Notice: Subject to any disclaimer, the term of this patent is extended or adjusted under 35 U.S.C. 154(b) by 48 days.

(21) Appl. No.: 10/292,668

(22) Filed: Nov. 12, 2002

(65) Prior Publication Data
US 2003/0092282 A1 May 15, 2003

(30) Foreign Application Priority Data
Nov. 12, 2001 (KR) .................................. 2001-70222

(51) Int. Cl.⁷ .................... C23C 16/00; C23C 14/00; C23F 1/00
(52) U.S. Cl. .................... 156/345.52; 156/345.51; 118/725; 118/728; 204/298.15
(58) Field of Search ................. 118/725, 728; 156/345.51, 345.52; 204/298.15

(56) References Cited

U.S. PATENT DOCUMENTS

| | | | | |
|---|---|---|---|---|
| 5,352,294 A | * | 10/1994 | White et al. | 118/725 |
| 5,421,893 A | * | 6/1995 | Perlov | 118/725 |
| 5,462,603 A | * | 10/1995 | Murakami | 118/719 |
| 5,558,717 A | * | 9/1996 | Zhao et al. | 118/715 |
| 5,562,947 A | | 10/1996 | White et al. | 427/255.5 |
| 6,120,609 A | * | 9/2000 | Selyutin et al. | 118/728 |
| 6,148,762 A | * | 11/2000 | Fukuda et al. | 118/715 |
| 6,435,798 B1 | * | 8/2002 | Satoh | 414/217 |

* cited by examiner

Primary Examiner—Parviz Hassanzadeh
Assistant Examiner—Karla Moore
(74) Attorney, Agent, or Firm—Duane Morris LLP

(57) ABSTRACT

A susceptor of an apparatus for manufacturing a semiconductor device includes a first part having a first lift pin hole, a second part combined with the first part and forming a space with the first part, wherein the second part has a second lift pin hole corresponding to the first lift pin hole, a heater disposed in the space, wherein the heater has a third lift pin hole corresponding to the first and second lift pin holes, a lift pin tube inserted in the first, second and third lift pin holes, wherein the lift pin tube is combined with the first and second part thereby preventing air from going into the space, and a lift pin passing through the lift pin tube.

16 Claims, 3 Drawing Sheets

SUSCEPTOR OF APPARATUS FOR MANUFACTURING SEMICONDUCTOR DEVICE

The present invention claims the benefit of Korean Patent Application No. 2001-70222, filed on Nov. 12, 2001 in Korea, which is hereby incorporated by reference for all purposes as if fully set forth herein.

BACKGROUND OF THE INVENTION

1. Field of the Invention

The present invention relates to an apparatus for manufacturing a semiconductor device and more particularly, to a susceptor of an apparatus for manufacturing a semiconductor device.

2. Discussion of the Related Art

A development for a new material has been actively performed in the field and diverse large-scale integrated circuits (LSI) such as ultra large-scale integrated circuits (ULSI) have been developed due to a rapid growth of the new material development. That is, because the new material for forming thin films such as an insulating layer, a semiconductor layer and a conductive layer, which constitute a semiconductor device, has been widely developed in the field, the large-scale integrated circuits (LSI) such as the ultra large-scale integrated circuits (ULSI) are available now. The semiconductor device is generally fabricated through repeated depositing and patterning processes. These processes are accomplished in an apparatus for manufacturing the semiconductor device under vacuum condition.

The apparatus for manufacturing the semiconductor device is classified variously according to a purpose. The apparatus generally includes a processing chamber that is an airtight reaction container, a controller that controls surroundings within the chamber, and a supplying system that stores and provides source materials.

FIG. 1 shows an apparatus for manufacturing a semiconductor device in the related art.

In FIG. 1, the apparatus 10 includes a chamber 20 a supplying part 50. The chamber 20 is an airtight reaction container, and a substrate 1 to be handled is disposed in the chamber 20. The supplying part 50 stores and provides source materials and reaction materials to the chamber 20.

The chamber 20 has an inlet 23, an outlet 24, an injector 22, and a susceptor 30. The inlet 23 is formed in a wall of the chamber 20, and the substrate 1 to be handled comes into and goes out of the chamber 20 through the inlet 23. The outlet 24 is also formed in a wall of the chamber 20 and is connected to a pump "P" that controls the pressure in the chamber 20. Thus, the air within the chamber 20 is exhausted out of the chamber 20 through the outlet 24 by the pump "P". The injector 22 is disposed on an inner surface of the upper part of the chamber 20 and is connected to the supplying part 50 outside the chamber 20 through a supplying pipe 51. Therefore, source materials and reactive materials from the supplying part 50 are diffused uniformly by the injector 22 after passing through the supplying pipe 51.

The susceptor 30 is disposed in the chamber 20, and the substrate 1 is located on the susceptor 30. The susceptor 30 may be made of graphite or silicon carbide (SiC), and may have a circular shape. The susceptor 30 has a heater 34 therein to accelerate chemical reactions of source materials and reactive materials. Additionally, the susceptor 30 is connected to a first driving instrument 52 such as a motor or an air cylinder, and moves upward and downward by the first driving instrument 52.

A lift pin base 40 is equipped under the susceptor 30, and a plurality of lift pins 42 are formed on the lift pin base 40. The plurality of lift pins 42 pass through the susceptor 30, and the plurality of lift pins 42 raise and lower the substrate 1 during loading or unloading of the substrate 1. The lift pin base 40 is connected to a second driving instrument 54 such as a motor or an air cylinder. Therefore, the lift pin base 40 and the plurality of lift pins 42 move upward and downward by the second driving instrument 54.

In the apparatus of FIG. 1, the substrate 1 is carried into the chamber 10 via the inlet 23 and is loaded on the susceptor 30 using the plurality of lift pins 42. Next, the air in the chamber 10 is exhausted through the outlet 24 by the pump "P". Source materials and reactive materials in the supplying part 50 are transmitted to the chamber through the supplying pipe 51, and are injected into the chamber 10 by the injector 22. The source materials and reactive materials react by applying electrical energy or thermal energy, so that a thin film is deposited on the substrate 1 or a thin film deposited on the substrate 1 is patterned.

FIG. 2 is a view of magnifying the susceptor of the apparatus for manufacturing a semiconductor device of FIG. 1. As stated above, the susceptor 30 has the heater 34 in order to speed up depositing and patterning of the thin film and in order to stabilize the depositing and patterning processes. Additionally, the lift pin base 40 of FIG. 1, on which a plurality of lift pins 42 are formed vertically with respect to the lift pin base 40, is arranged under the susceptor 30. The plurality of lift pins 42 pass through the susceptor 30. The susceptor 30 and the lift pin base 40 are connected to the first and second driving instruments 52 and 54 of FIG. 1, respectively, and move upward and downward by the first and second driving instruments 52 and 54.

During a loading step when the substrate 1 is put on the susceptor 30 in the chamber 20 or during an unloading step when the substrate 1 is taken out the chamber 20, the lift pin base 40 rises by the second driving instrument 52 of FIG. 2. Then, the plurality of lift pins 42 are protruded over the upper surface of the susceptor 30 and lift up the substrate 1. Therefore, loading and unloading of the substrate 1 get easy.

FIG. 3 is a cross-sectional view along the line III—III of FIG. 2. In FIG. 3, the susceptor 30 of the related art is composed of an upper part 32, a lower part 33, and a heater 34 disposed between the upper and lower parts 32 and 33. The upper part 32, the lower part 33, and the heater 34 have first, second, and third lift pin holes 32a, 33a, 34a that the lift pin 42 passes through, respectively. The lift pin 42 has a hung portion 42a and the first lift pin hole 32a has a hanging portion 32b on the top. The hanging portion 32b corresponds to the hung portion 42a and is hollow. The hanging portion 32b has a wider width than the hung portion 42a and the other portion of the first lift pin hole 32a except for the hanging portion 32b has a narrower width than the hung portion 42a.

While the lift pin 42 has the lowest position as shown by a dotted line, that is, while a process of handling the substrate 1 of FIG. 1 is going on, the hung portion 42a is located in the hanging portion 32b. Therefore, the substrate 1 sticks to the susceptor 30, and is dealt with. Meanwhile, when the substrate 1 is loaded or unloaded, the lift pin 42 rises through the susceptor 30 and raises the substrate 1. Thus, the substrate 1 is situated on the hung portion 42a of the lift pin 42 and is carried out of the chamber 10.

However, in the susceptor of the related art, the heater 34 is oxidized easily. The source materials and the reactive materials include an oxide having oxygen ($O_2$) or ozone (O₃). The oxide permeates the susceptor 30 through the second lift pin hole 33a along the path shown by the arrow in FIG. 3, and oxidizes the heater 34. The heater 34 is oxidized very more near the third lift pin hole 34a of the heater 34, which is close by the second lift pin hole 33a. Accordingly, the heater 34 has a different temperature partially, and the substrate 1 is not heated uniformly. The thin film to be deposited or to be patterned has bad properties.

Moreover, if the heater 34 is oxidized excessively, the heater 34 is not operated normally, and the manufacturing process is made impossible. The oxidation of the heater 34 lowers the productivity of the semiconductor device, and has an affect on uniformity, critical dimension, profile, repeatability, etc. of the semiconductor device.

SUMMARY OF THE INVENTION

Accordingly, the present invention is directed to a susceptor of an apparatus for manufacturing a semiconductor device that substantially obviates one or more of problems due to limitations and disadvantages of the related art.

An advantage of the present invention is to provide a susceptor of an apparatus for manufacturing a semiconductor device that prevents a heater therein from being oxidized.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a susceptor of an apparatus for manufacturing a semiconductor device includes a first part having a first lift pin hole, a second part combined with the first part and forming a space with the first part, wherein the second part has a second lift pin hole corresponding to the first lift pin hole, a heater disposed in the space, wherein the heater has a third lift pin hole corresponding to the first and second lift pin holes, a lift pin tube inserted in the first, second and third lift pin holes, wherein the lift pin tube is combined with the first and second part thereby preventing air from going into the space, and a lift pin passing through the lift pin tube.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, which is illustrated in the accompanying drawings.

Figure 1:
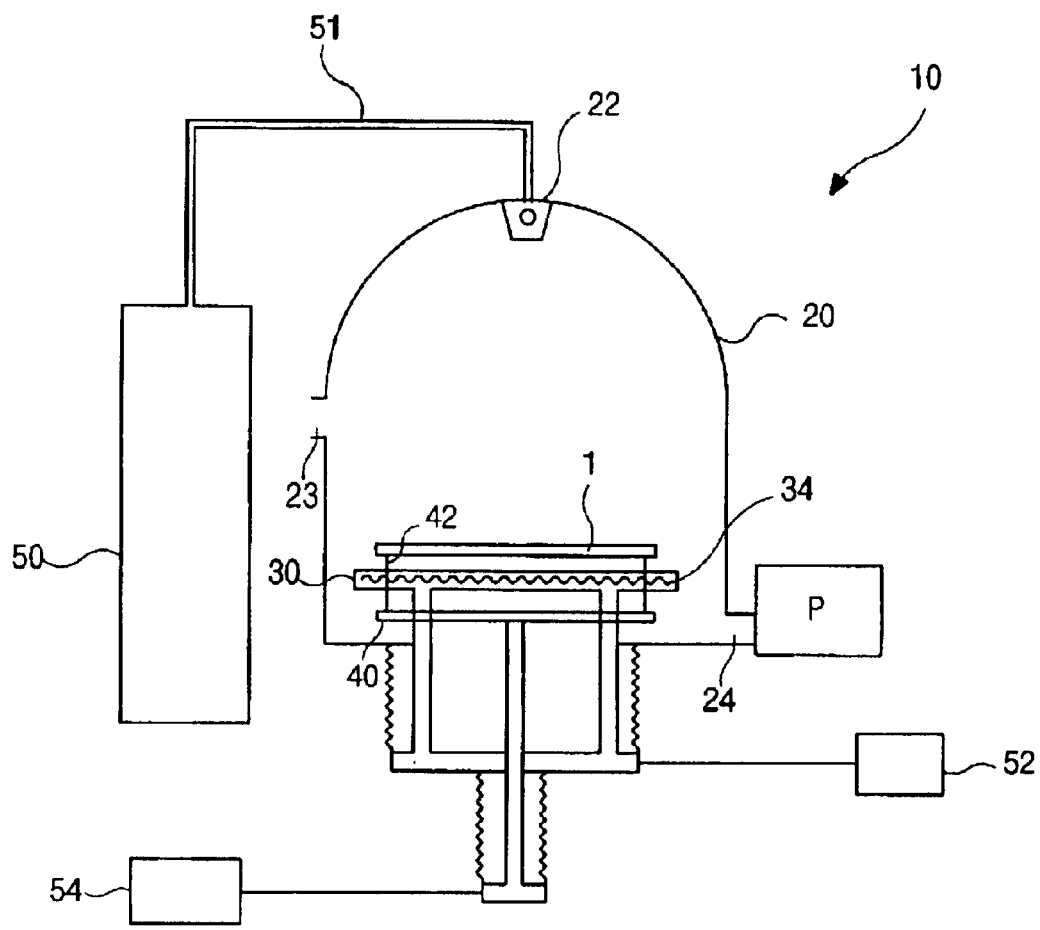
FIG. 1 is a view of showing an apparatus for manufacturing a semiconductor device in the related art.
Figure 2:
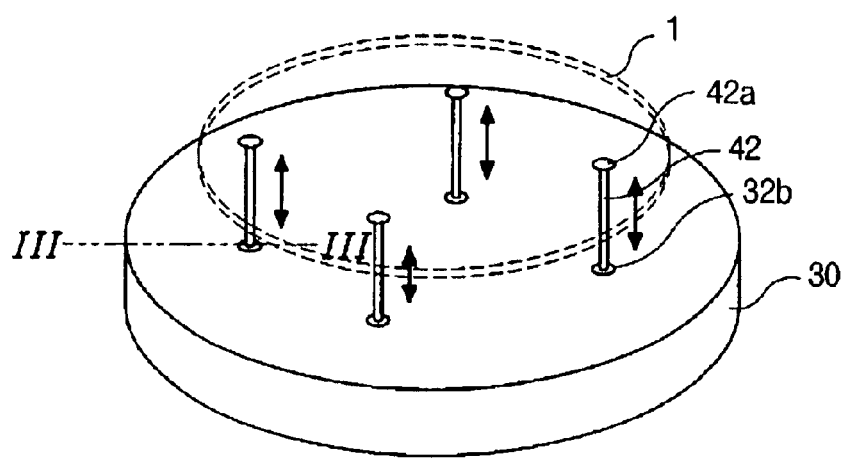
FIG. 2 is a view of magnifying a susceptor of the apparatus for manufacturing a semiconductor device of FIG. 1.
Figure 3:
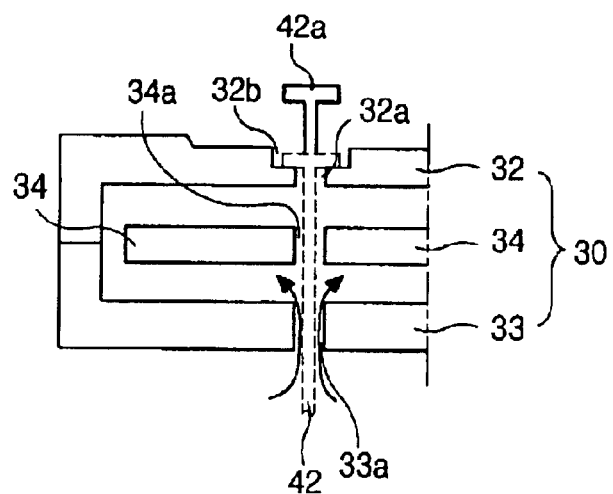
FIG. 3 is a cross-sectional view along the line III—III of FIG. 2.
Figure 4:
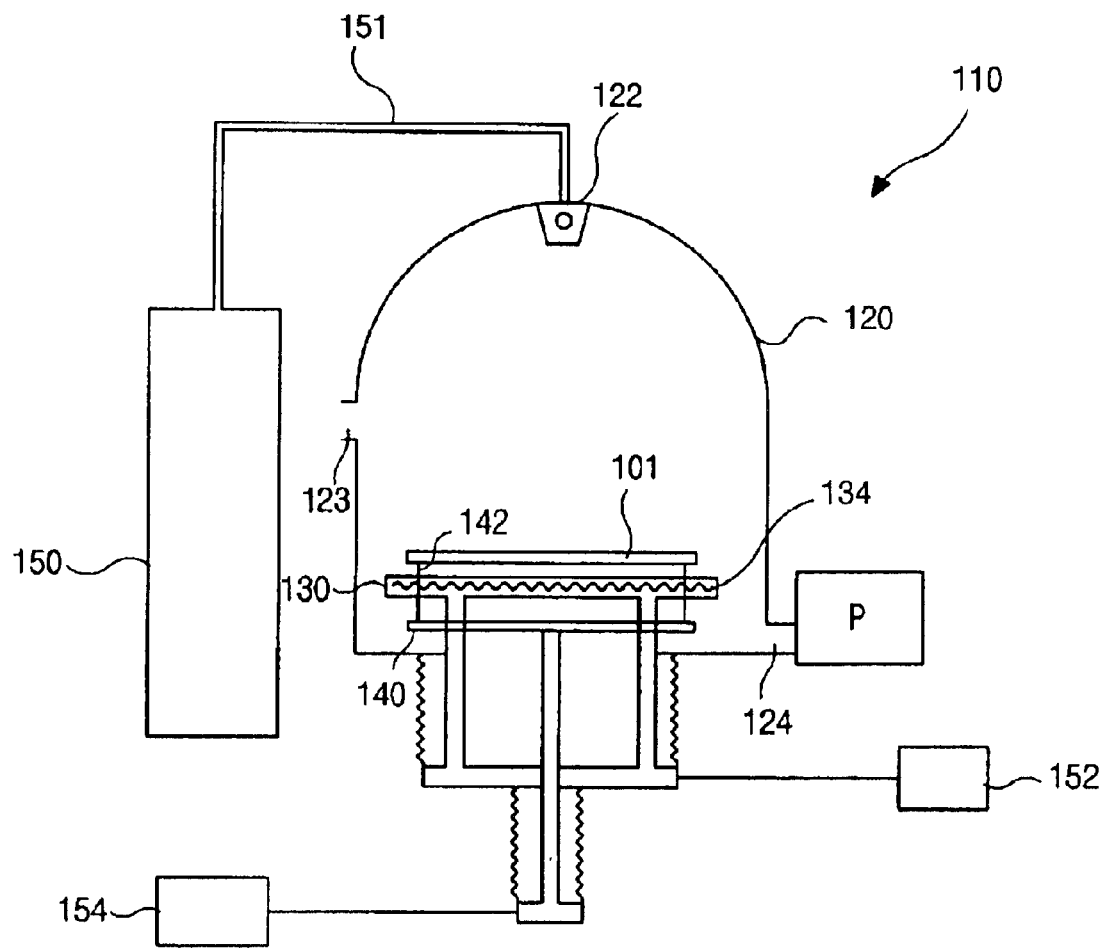
FIG. 4 is showing an apparatus for manufacturing a semiconductor device according to an embodiment of the present invention.

FIG. 4 shows an apparatus for manufacturing a semiconductor device according to an embodiment of the present invention. In FIG. 4, the apparatus 110 includes a chamber 120 and a supplying part 150. The chamber 120 is an airtight reaction container, and in the chamber 120, a substrate 101 such as a silicon wafer to be handled is disposed. Thus, a process that a thin film is deposited on the substrate 101 or a thin film formed on the substrate 101 is patterned is accomplished in the chamber 120. The supplying part 150 stores and supplies source materials and reaction materials to the chamber 120.

The chamber 120 has an inlet 123, an outlet 124, an injector 122, and a susceptor 130. The upper part of the chamber 120 may be dome-shaped. The inlet 123 is formed in a wall of the chamber 120, and the substrate 101 to be handled comes into and goes out of the chamber 120 through the inlet 123. The outlet 124 is also formed in a wall of the chamber 120 and is connected to a pump "P" that controls the pressure of the chamber 120. Thus, the air within the chamber 120 is exhausted out of the chamber 120 through the outlet 124 by the pump "P". The injector 122 is disposed on an inner surface of the upper part of the chamber 120 and is connected to the supplying part 150 outside the chamber 120 through a supplying pipe 151. Therefore, source materials and reactive materials from the supplying part 150 are diffused uniformly by the injector 22 after passing through the supplying pipe 151.

The susceptor 130 is disposed in the chamber 120, and the substrate 101 is located on the susceptor 130. The susceptor 130 may be made of graphite or silicon carbide (SiC) and may have a circular shape. The susceptor 130 has a heater 134 therein to accelerate chemical reactions of source materials and reactive materials. Additionally, the susceptor 130 is connected to a first driving instrument 152, which may be a motor or an air cylinder, and moves upward and downward by the first driving instrument 152.

A lift pin base 140 is equipped under the susceptor 130, and a plurality of lift pins 142 is formed on the lift pin base 140. The plurality of lift pins 142 pass through the susceptor 130, and the plurality of lift pins 142 raise and lower the substrate 101. The lift pin base 140 is connected to a second driving instrument 154, which may be a motor or an air cylinder too. Therefore, the lift pin base 140 and the plurality of lift pins 142 move upward and downward by the second driving instrument 154.

In the apparatus of the present invention, the substrate 101 is carried into the chamber 110 via the inlet 123 and is situated on the raised plurality of lift pins 142. The plurality of lift pins 142 go down with the lift pin base 140 by the second driving instrument 154, and locate the substrate 101 on the susceptor 130. Next, the air in the chamber 110 is exhausted through the outlet 124 by the pump "P". Source materials and reactive materials in the supplying part 150 are transmitted to the chamber 120 through the supplying pipe 151 and are injected uniformly into the chamber 110 by the injector 122. When electrical energy or thermal energy is applied, the source materials and the reactive materials react, so that a thin film is deposited on the substrate 101 or a thin film deposited on the substrate 101 is patterned.

Figure 5:
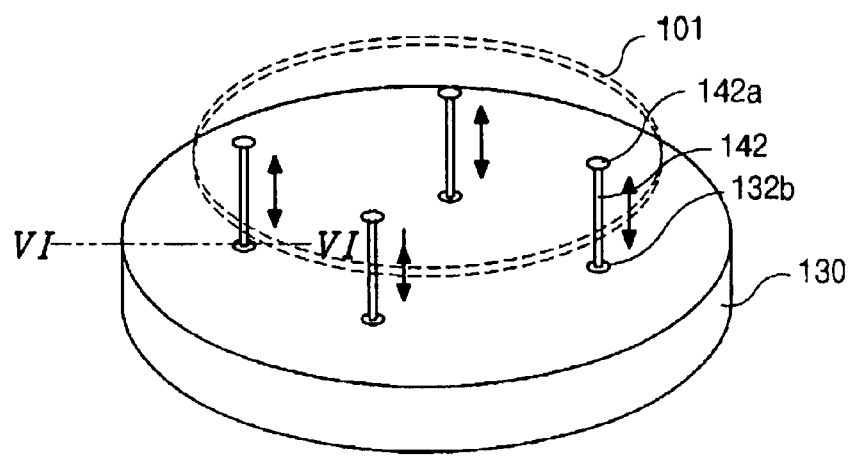
FIG. 5 is a view of magnifying a susceptor of the apparatus for manufacturing a semiconductor device of FIG. 4.

FIG. 5 is a view of magnifying the susceptor of the apparatus for manufacturing a semiconductor device of FIG. 4. As stated above, the susceptor 130 has the heater 134 in order to speed up depositing and patterning of the thin film and in order to stabilize the depositing and patterning processes. Additionally, the lift pin base 140 of FIG. 4, on which a plurality of lift pins 142 are formed vertically with respect to the lift pin base 140, is arranged under the susceptor 130. The plurality of lift pins 142 pass through the susceptor 130. The susceptor 130 and the lift pin base 140 are connected to the first and second driving instruments 152 and 154 of FIG. 4, respectively, and move upward and downward by the first and second driving instruments 152 and 154.

During a loading step when the substrate 101 is put on the susceptor 130 in the chamber 120 or during an unloading step when the substrate 101 is taken out the chamber 120, the lift pin base 140 rises by the second driving instrument 152 of FIG. 5, and the plurality of lift pins 142 are protruded over the upper surface of the susceptor 130. Then, the plurality of lift pins 142 lift up the substrate 101, and loading and unloading of the substrate 101 get easy.

Figure 6:
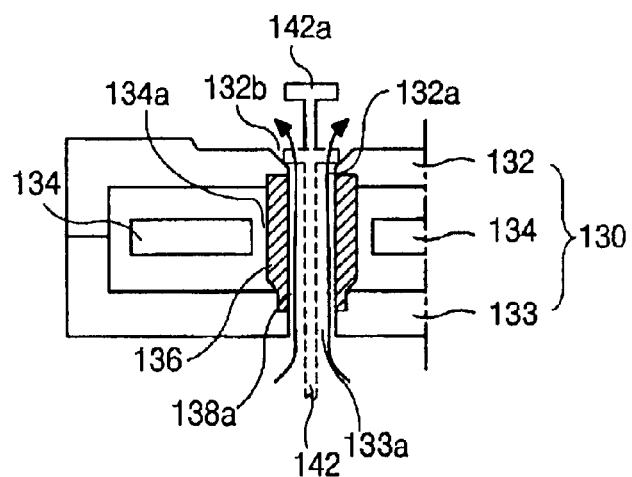
FIG. 6 is a cross-sectional view along the line VI—VI of FIG. 5.
Figure 7:
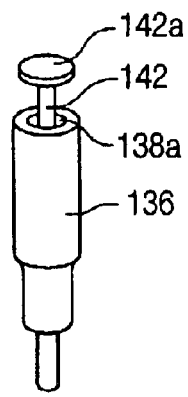
FIG. 7 is a view showing a lift pin and a lift pin tube according to the embodiment of the present invention.

FIG. 6 is a cross-sectional view along the line VI—VI of FIG. 5 and FIG. 7 is a view showing a lift pin and a lift pin tube according to the embodiment of the present invention. In FIG. 6 and FIG. 7, the susceptor 130 of the present invention is composed of an upper part 132, a lower part 133, and a heater 134 disposed between the upper and lower parts 132 and 133. The upper part 132, the lower part 133 and the heater 134 have first, second, and third lift pin holes 132a, 133a and 134a, respectively. The lift pin 142 has a hung portion 142a and the first lift pin hole 132a has a hanging portion 132b on the top. The hanging portion 132b corresponds to the hung portion 142a and is hollow.

A lift pin tube 136 is inserted in the first, second and third lift pin holes 132a, 133a and 134a, and the lift pin tube 136 is connected to the first and second parts 132 and 133 without a space thereby air does not go into the inside of the susceptor 130. The lift pin tube 136 has a shape of cylinder, and the lift pin 142 passes through a tube hole 138 of the lift pin tube 136. The lower part of the lift pin tube 136 may have a narrower outer diameter than the upper part of the lift pin tube 136 while the lower part of the lift pin tube 135 have the same inner diameter as the upper part of the lift pin tube 136. The lift pin tube 136 is made of aluminum oxide ($Al_2O_3$), which keeps the heater 136 stable at high temperature.

The hanging portion 132b has a larger diameter than the hung portion 142a. Additionally, the tube hole 138 has a larger diameter than the lift pin 142 and has a smaller diameter than the hung portion 142a. The diameter of the tube hole 138 and may equal those of the first and second lift pin holes 132a and 133a except for the hanging portion 132b. The third lift pin hole 134a has a larger diameter than the outer surface of the lift pin tube 136.

Therefore, while the lift pin 142 has the lowest position as shown by a dotted line, that is, while a process of handling the substrate 101 of FIG. 4 is going on, the hung portion 142a is located in the hanging portion 132b. At this time, the substrate 101 sticks to the susceptor 130, and the depositing or patterning process is accomplished. Meanwhile, when the substrate 101 is loaded or unloaded, the lift pin 142 rises and raises the substrate 101. Thus, the substrate 101 is situated on the hung portion 142a of the lift pin 142.

In the present invention, though an oxide including oxygen ($O_2$) or ozone ($O_3$) permeates the inside of the susceptor 130, the oxide does not contact the heater 134 due to the lift pin tube 136. Therefore, the oxide that goes into the susceptor 134 via the second lift pin hole 133a passes through the tube hole 138, and goes out into the chamber 120 of FIG. 4.

The contacted lift pin tube 136 and the contacted first and second lift pin holes 132a and 133a may have screw threads, and may be united by the screw threads. On the other hand, the lift pin tube 136 may be combined with the first and second lift pin holes 132a and 133a by being sealed.

It will be apparent to those skilled in the art that various modifications and variation can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A susceptor of an apparatus for manufacturing a semiconductor device, comprising:

a first part having a first lift pin hole;

a second part combined with the first part and forming a space with the first part, the second part having a second lift pin hole corresponding to the first lift pin hole;

a heater disposed in the space, the heater having a third lift pin hole corresponding to the first and second lift pin holes;

a lift pin tube inserted in the first, second and third lift pin holes, the lift pin tube comprising screw threads combined with the first and second part thereby preventing air from going into the space; and a lift pin passing through the lift pin tube.

2. The susceptor according to claim 1, wherein the lift pin tube includes aluminum oxide ($Al_2O_3$).

3. The susceptor according to claim 1, wherein the lift pin has a hung portion and the first part has a hanging portion corresponding to the hung portion on the top.

4. The susceptor according to claim 3, wherein the hanging portion has a larger diameter than the hung portion.

5. The susceptor according to claim 4, wherein the lift pin tube has a tube hole having a larger diameter than the lift pin.

6. The susceptor according to claim 5, wherein the tube hole has a smaller diameter than the hung portion.

7. The susceptor according to claim 6, wherein the tube hole has the same diameter as the first and second lift pin holes except for the hanging portion.

8. The susceptor according to claim according 7, wherein the third lift pin hole has a larger diameter than an outer surface of the lift pin tube.

9. A susceptor of an apparatus for manufacturing a semiconductor device, comprising:

a first part having a first lift pin hole;

a second part combined with the first part and forming a space with the first part, the second part having a second lift pin hole corresponding to the first lift pin hole;

a heater disposed in the space, the heater having a third lift pin hole corresponding to the first and second lift pin holes;

a lift pin tube inserted in the first, second and third lift pin holes, wherein the first and second parts combined with the lift pin tube have screw threads thereby preventing air from going into the space; and a lift pin passing through the lift pin tube.

10. The susceptor according to claim 9 wherein the lift pin tube includes aluminum oxide ($Al_2O_3$).

11. The susceptor according to claim 10 wherein the lift pin has a hung portion and the first part has a hanging portion corresponding to the hung portion on the top.

12. The susceptor according to claim 11 wherein the hanging portion has a larger diameter than the hung portion.

13. The susceptor according to claim 12 wherein the lift pin tube has a tube hole having a larger diameter than the lift pin.

14. The susceptor according to claim 13 wherein the tube hole has a smaller diameter then the hung portion.

15. The susceptor according to claim 14 wherein the tube hole has the same diameter as the first and second lift pin holes except for the hanging portion.

16. The susceptor according to claim according 15 wherein the third lift pin hole has a larger diameter than an outer surface of the lift pin tube.

* * * * *